(12) United States Patent
Han et al.

(10) Patent No.: US 7,151,702 B2
(45) Date of Patent: Dec. 19, 2006

(54) HIGH VOLTAGE GENERATORS HAVING AN INTEGRATED DISCHARGE PATH FOR USE IN NON-VOLATILE SEMICONDUCTOR MEMORY DEVICES

(75) Inventors: Wook-Ghee Han, Gyeonggi-do (KR); Dae-Seok Byeon, Gyeonggi-do (KR); Sung-Soo Lee, Gyeonggi-do (KR); Young-Ho Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 10/915,294

(22) Filed: Aug. 10, 2004

(65) Prior Publication Data
US 2005/0270882 A1    Dec. 8, 2005

(30) Foreign Application Priority Data
Jun. 7, 2004    (KR) ............... 10-2004-0041300

(51) Int. Cl.
*G11C 5/14* (2006.01)
(52) U.S. Cl. ............... 365/189.09; 365/185.18; 365/226
(58) Field of Classification Search ............... 365/226
See application file for complete search history.

(56) References Cited

U.S. PATENT DOCUMENTS

| | | | |
|---|---|---|---|
| 4,733,375 A | 3/1988 | Terashima | 365/206 |
| 5,175,706 A | 12/1992 | Edme | 365/226 |
| 5,180,928 A * | 1/1993 | Choi | 327/541 |
| 5,511,026 A | 4/1996 | Cleveland et al. | 365/189.09 |
| 5,770,963 A * | 6/1998 | Akaogi et al. | 327/309 |
| 5,889,720 A | 3/1999 | Lisart et al. | 365/226 |
| 5,892,267 A * | 4/1999 | Takada | 327/536 |
| 5,898,335 A * | 4/1999 | Miyamoto et al. | 327/535 |
| 6,292,048 B1 * | 9/2001 | Li | 327/536 |

* cited by examiner

*Primary Examiner*—Son Mai
(74) *Attorney, Agent, or Firm*—Myers Bigel Sibley & Sajovec, P.A.

(57) ABSTRACT

High voltage generators include a charge pump and a ripple reduction circuit that includes an integrated discharge path. The ripple reduction circuit limits the voltage level from a charge pump when the charge pump is in a first operating mode and provides a discharge path that from the output terminal of the ripple reduction circuit to the output of the charge pump when the charge pump is in a second operating mode. Semiconductor memories incorporating such high voltage generators are also provided. Coupling circuits having an integrated discharge path are also provided.

19 Claims, 8 Drawing Sheets

HIGH VOLTAGE GENERATORS HAVING AN INTEGRATED DISCHARGE PATH FOR USE IN NON-VOLATILE SEMICONDUCTOR MEMORY DEVICES

CROSS REFERENCE TO RELATED APPLICATIONS

This application claims priority from Korean Patent Application No. 2004-41300, filed on Jun. 7, 2004, the disclosure of which is incorporated by reference as if set forth in its entirety.

FIELD OF THE INVENTION

Embodiments of the present invention relate to semiconductor device and more particularly to high voltage generators.

BACKGROUND OF THE INVENTION

The growth of information processing apparatus, such as computers, has resulted in an increase in the need for high-speed operation and large-capacity in semiconductor memory devices employed as important components of the information processing apparatus.

Nonvolatile semiconductor memory device, such as flash EEPROM (electrically erasable programmable read only memory) etc., are being widely used as a data storage device of portable electronic systems. A NAND flash semiconductor memory device having a memory cell array of NAND cells is well known in the field as a memory that has a relatively high degree of memory cell integration and is flash-erasable. In this flash semiconductor memory device a high voltage, e.g., 15V through 20V, relatively higher than power source voltage, is typically applied to a selected word line during a programming operation.

A high voltage should be used in the nonvolatile semiconductor memory device in order to erase or program data through a well-known F-N tunneling or channel hot electron injection method. Typically, the high voltage to be used in the nonvolatile semiconductor memory device may be applied through an external pin of a chip or may be generated internally within a chip. Generally, in generating the high voltage within the chip, a high voltage generating circuit containing a high voltage pump or charge pump for performing a charge pumping operation is employed in the chip. An example of a circuit for the generation of a high program voltage is disclosed in, e.g., U.S. Pat. No. 5,889,720.

FIG. 1 illustrates a use of high voltage pump in a conventional semiconductor memory device. Referring to FIG. 1, a high voltage generated in the high voltage pump 2 is applied to a peripheral circuit 4 provided within a chip through an output line L1. The peripheral circuit 4 may be provided as a functional block for selectively applying high voltage to a word line, like a row line level selection unit etc. in a nonvolatile semiconductor memory device. An exemplary embodiment of the high voltage pump 2 is illustrated in FIG. 2.

Referring to FIG. 2, a plurality of MOS transistors MP1, MN1–MNn and a plurality of capacitors C1–Cn have a mutually connected configuration. Operation of the charge pump in the high voltage pump 2 of FIG. 2 is described as follows.

When a pump enable signal nPUMPen for a charge supply is enabled as a low state and a first phase control signal P1 and a second phase control signal P2 are applied as mutually exclusive pulse signals; a charge pumping operation for the generation of high voltage starts. That is, a charge supply transistor MP1 is turned on to apply power source voltage to a node NT0, and the first phase control signal P1 has a high state and the second phase control signal P2 has a low state, then a first charge transfer transistor MN1 is turned on. The charge flowing in the node NT0 is transferred to a node NT1. The amount of the charge transferred to the node NT1 is increased by an operation of a first capacitor C1. Then, when the first phase control signal P1 is transited to a low state and the second phase control signal P2 is transited to a high state, a second charge transfer transistor MN2 is turned on to again increase the charge amount of the node NT1 and to transfer it to a node NT2. In this case a gate voltage of the first charge transfer transistor MN1 has transitioned to the low state, thus the charge of the node NT1 does not flow backward to the node NT0. This operation is consecutively performed in the charge transfer transistors that are connected with one another in series, then the pumped charge is transferred to an output terminal. The pumped high voltage higher than power source voltage is generated in a pumping output terminal Vpump provided as a source terminal of a final charge transfer transistor MNn.

A level of the high voltage generated in the pumping output terminal Vpump of the high voltage pump shown in FIG. 2 increases in sections where the phase control signal becomes high, and decreases by a predetermined level in sections where the phase control signal is maintained as a low state. Thus a voltage ripple may be generated as shown in a waveform RS of FIG. 4.

The ripple may need to be removed if the apparatus needs a uniform high voltage. In removing the voltage ripple it may be difficult to employ a ripple removing device given the level of integration of a semiconductor memory. That is, it may be necessary to use a ripple removing device of a smaller size than may be sufficient to withstand the high voltage of the pumping output terminal when the output terminal is disabled.

Furthermore, a typical pumping output terminal is provided with a specific discharge circuit for discharging the high voltage when the high voltage pump is disabled, but the specific discharge circuit may also limit or be limited by the level of integration.

SUMMARY OF THE INVENTION

Some embodiments of the invention provide a high voltage generating circuit for use in a semiconductor memory device that includes a charge pump for generating a high voltage and a ripple reduction circuit for limiting a voltage level of the high voltage applied from a pumping output terminal of the charge pump when the charge pump is in a first operating mode and outputting the voltage level limited high voltage as a ripple-reduced high voltage to an output terminal. The ripple reduction circuit includes a charge discharge path that is provided from the output terminal to the pumping output terminal when the charge pump is in a second operating mode.

In certain embodiments of the present invention, the ripple reduction circuit includes a MOS transistor of a diode connection type. The ripple reduction circuit may include a single MOS transistor of a diode connection type.

In further embodiments of the present invention, the ripple reduction circuit includes at least one n-type MOS transistor in which a gate terminal and a drain terminal are connected in common to the charge pump output terminal and in which a source terminal is connected to the ripple reduction circuit output terminal and to a bulk region of the at least one n-type MOS transistor.

In some embodiments of the present invention, a nonvolatile semiconductor memory device includes a memory cell array having memory cells that are connected in a matrix type with a plurality of bit lines and a plurality of word lines, row and column decoders for decoding an address signal and selecting the word line and the bit line, a program loop counting signal generator for generating a loop counting signal and a program voltage generator for generating a program voltage utilizing a charge pump in response to the loop counting signal. The program voltage generator includes a ripple reduction circuit for limiting a voltage for a high voltage applied from a pumping output terminal of the charge pump when the charge pump is in a first operating mode, and for outputting the ripple-reduced high voltage as the program voltage to an output terminal, the ripple reduction circuit having a charge discharge path that is provided from the output terminal to the pumping output terminal when the charge pump is in a second operating mode. A row line level selection unit is also provided for applying one of a pass voltage, a read voltage and a program voltage provided from the program voltage generator to the word lines in conformity with row address decoding information during a program operating mode.

In certain embodiments of the present invention, the ripple reduction circuit includes at least one n-type MOS transistor in which a gate terminal and a drain terminal are connected in common to the pumping output terminal and in which a source terminal is connected to a bulk region.

In still further embodiments of the present invention, a nonvolatile semiconductor memory device includes a memory cell array having memory cells that are connected in a matrix type with a plurality of bit lines and a plurality of word lines, row and column decoders for decoding an address signal and selecting the word line and the bit line and an erase voltage generator for generating an erase voltage utilizing a charge pump. The erase voltage generator includes a ripple reduction circuit for limiting a voltage for a high voltage applied from a pumping output terminal of the charge pump when the charge pump is in a first operating mode, and for outputting the ripple-reduced high voltage as the erase voltage to an output terminal, the ripple reduction circuit having a charge discharge path that is provided from the output terminal to the pumping output terminal when the charge pump is in a second operating mode. A row line level selection unit is also provided for applying a pass voltage, a read voltage and an erase voltage provided from the erase voltage generator, to the word lines in conformity with row address decoding information during an erase operating mode. The ripple reduction circuit may include at least one n-type MOS transistor in which a gate terminal and a drain terminal are commonly connected to the pumping output terminal and in which a source terminal is connected to a bulk region.

In yet other embodiments of the present invention, a nonvolatile semiconductor memory device includes a memory cell array having a plurality of cell blocks, the cell blocks respectively having a plurality of cell units that are connected with one another every at a crossing point of row and column, a plurality of row and column decoders selected or unselected by an address corresponding to the plurality of cell blocks, a plurality of row and column control circuits for controlling the row and column decoders and an operation control circuit, which operates to enable to perform program, erase and read operations through the plurality of row and column control circuits. The operation control circuit includes a high voltage pump to generate a high voltage higher than power source voltage and having a ripple removal circuit that is connected to the high voltage pump so as to remove a voltage ripple and that forms a discharge path while the high voltage pump is disabled.

In certain embodiments, the ripple reduction circuit includes an n-type MOS transistor in which a gate terminal and a drain terminal are commonly connected to a pumping output terminal and in which a source terminal is connected to a bulk region. The ripple reduction circuit may be constructed of a plurality of MOS transistors which are diode-coupled.

Some embodiments of the present invention provide a high voltage generating circuit for use in a semiconductor memory device that includes a charge pump for generating a high voltage at a charge pump output terminal. A ripple reduction circuit is electrically coupled to the charge pump and configured to clamp the high voltage at the charge pump output terminal to reduce ripple in the high voltage when the charge pump is enabled and output the clamped voltage to a ripple reduction circuit output terminal and provide a charge discharge path from the ripple reduction circuit output terminal to the charge pump output terminal when the charge pump is disabled.

The ripple reduction circuit may include a MOS transistor having a first controlled terminal and a controlling terminal coupled to the charge pump output terminal and a second controlled terminal and a bulk region coupled to the ripple reduction circuit output terminal. In particular embodiments of the present invention, the MOS transistor is an n-type MOS transistor, the first controlled terminal is a drain, the first controlling terminal is a gate and the second controlled terminal is a source of the n-type MOS transistor.

In further embodiments of the present invention, the ripple reduction circuit includes an n-type MOS transistor. The n-type MOS transistor includes a p-type semiconductor substrate, an n-type semiconductor well region in the p-type semiconductor substrate, a p-type semiconductor well region in the n-type semiconductor well region, n-type semiconductor source and drain regions in the p-type semiconductor well region and a gate contact disposed between the source and drain regions. The drain region and the gate contact may be electrically coupled to the charge pump output terminal and the source region, the p-type semiconductor well region and the n-type semiconductor well region may be electrically coupled to the ripple reduction circuit output terminal.

Further embodiments of the present invention include a non-volatile semiconductor memory devices that includes the high voltage generating circuits described above. The high voltage generating circuit may be configured to generate a program voltage and/or an erase voltage.

Still additional embodiments of the present invention provide circuits for coupling a high voltage charge pump to a semiconductor memory. The circuit includes a transistor having a bulk region of the transistor coupled to an input or an output of the transistor so as to provide an integrated discharge path from the output of the transistor to the input of the transistor through the bulk region when the high voltage charge pump is not enabled and block the discharge path through the bulk region when the high voltage charge pump is enable. The transistor may be an n-type MOS transistor, wherein the drain and gate of the transistor are coupled together and to the input of the transistor and the source and the bulk region are coupled together and to the output of the transistor.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Figure 1:
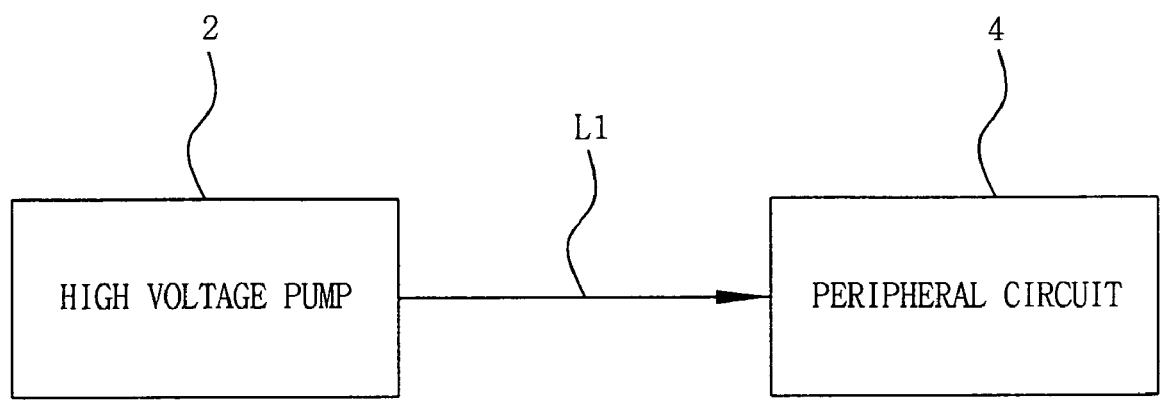
FIG. 1 is a block diagram of a conventional semiconductor memory device.
Figure 2:
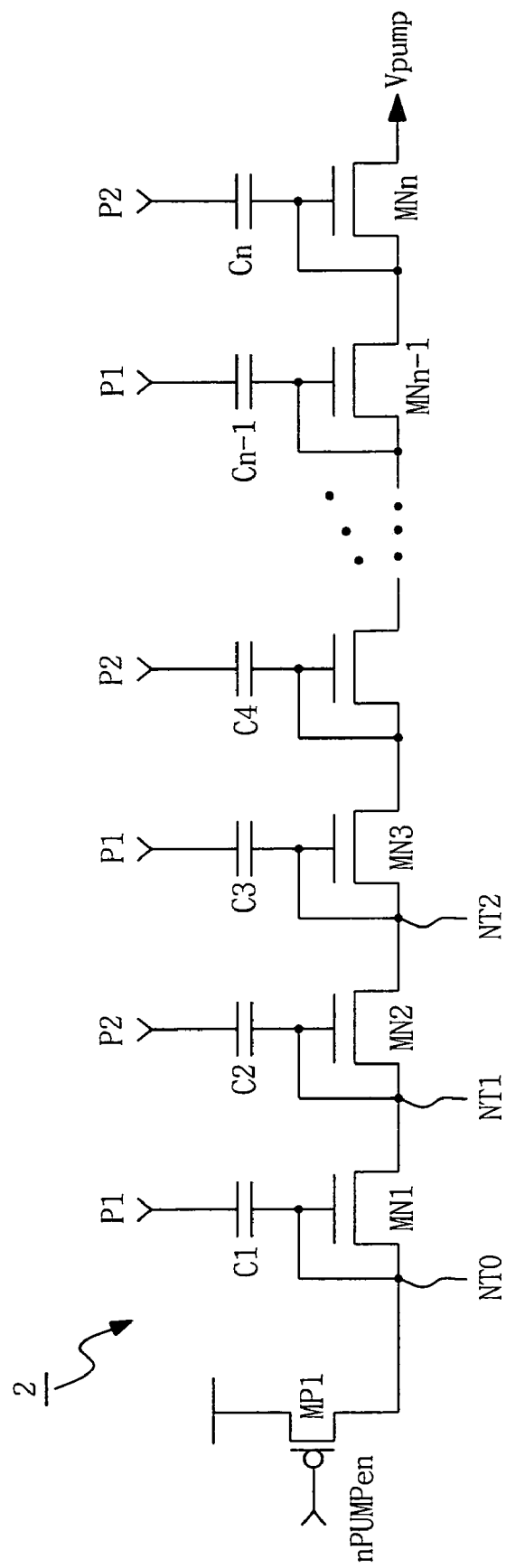
FIG. 2 is a circuit diagram of a high voltage pump shown in FIG. 1.

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
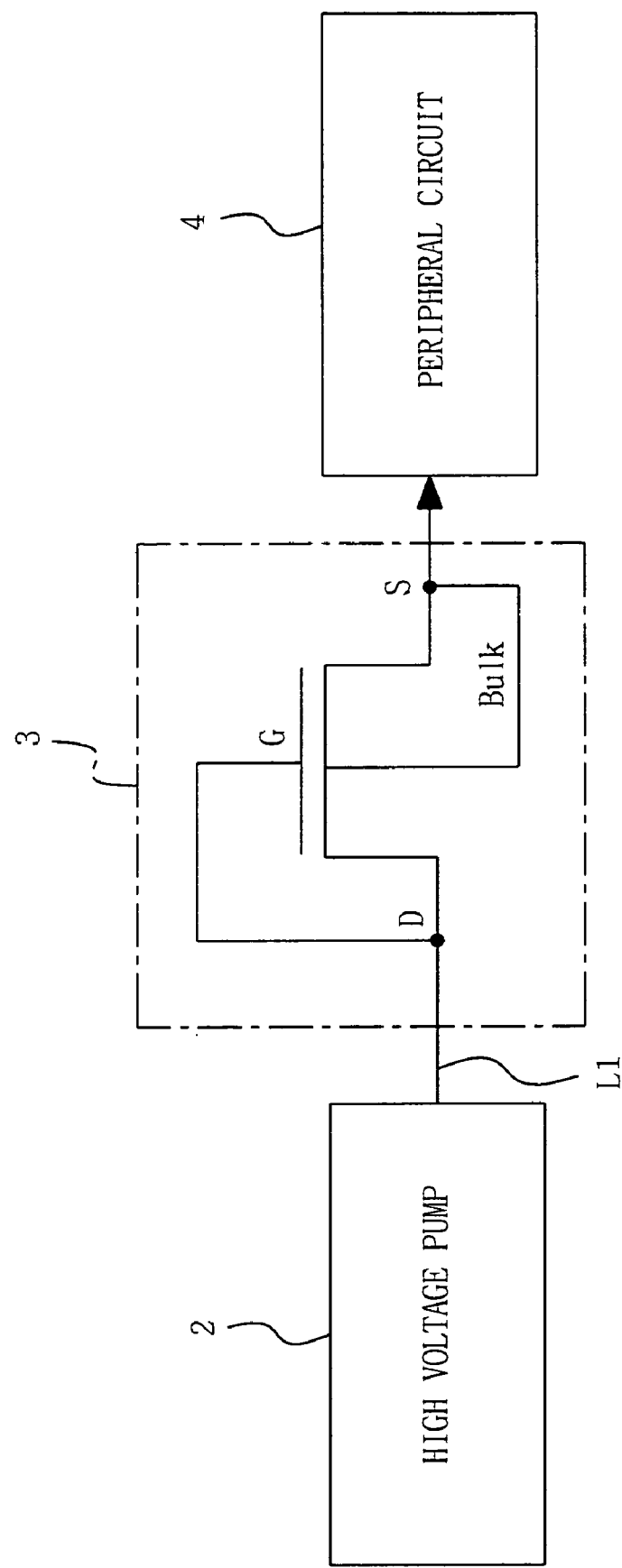
FIG. 3 is a block diagram of a high voltage generating circuit according to some embodiments of the present invention.

FIG. 3 illustrates a high voltage generating circuit for use in a nonvolatile semiconductor memory device according to some embodiments of the present invention. Referring to FIG. 3, a ripple reduction circuit 3 is connected between a high voltage pump 2 and a peripheral circuit 4. The high voltage generating circuit includes the high voltage pump 2 and the ripple reduction circuit 3. A high voltage output after removing or reducing ripple is applied to the peripheral circuit 4. The ripple reduction circuit 3 limits a voltage level of a high voltage applied from a pumping output terminal L1 and outputs the ripple-reduced high voltage to an output terminal S when the high voltage pump 2 is enabled. Also, when the high voltage pump 2 is disabled, the ripple reduction circuit 3 has a charge discharge path that is provided from the output terminal S to the pumping output terminal L1. In some embodiments, the ripple reduction circuit 3 may be provided as a MOS transistor, such as an N-type MOS transistor, having a controlling terminal, such as the gate terminal G and first controlled terminal, such as the drain terminal D, commonly connected to the pumping output terminal L1 and a second controlled terminal, such as the source terminal S, connected to a bulk region Bulk of the N-type MOS transistor. The connection of the source terminal S to the bulk region Bulk may provide an integrated discharge path so that charge at the output of the transistor may be discharged to the terminal L1 through the bulk region Bulk and the drain terminal D.

Figure 4:
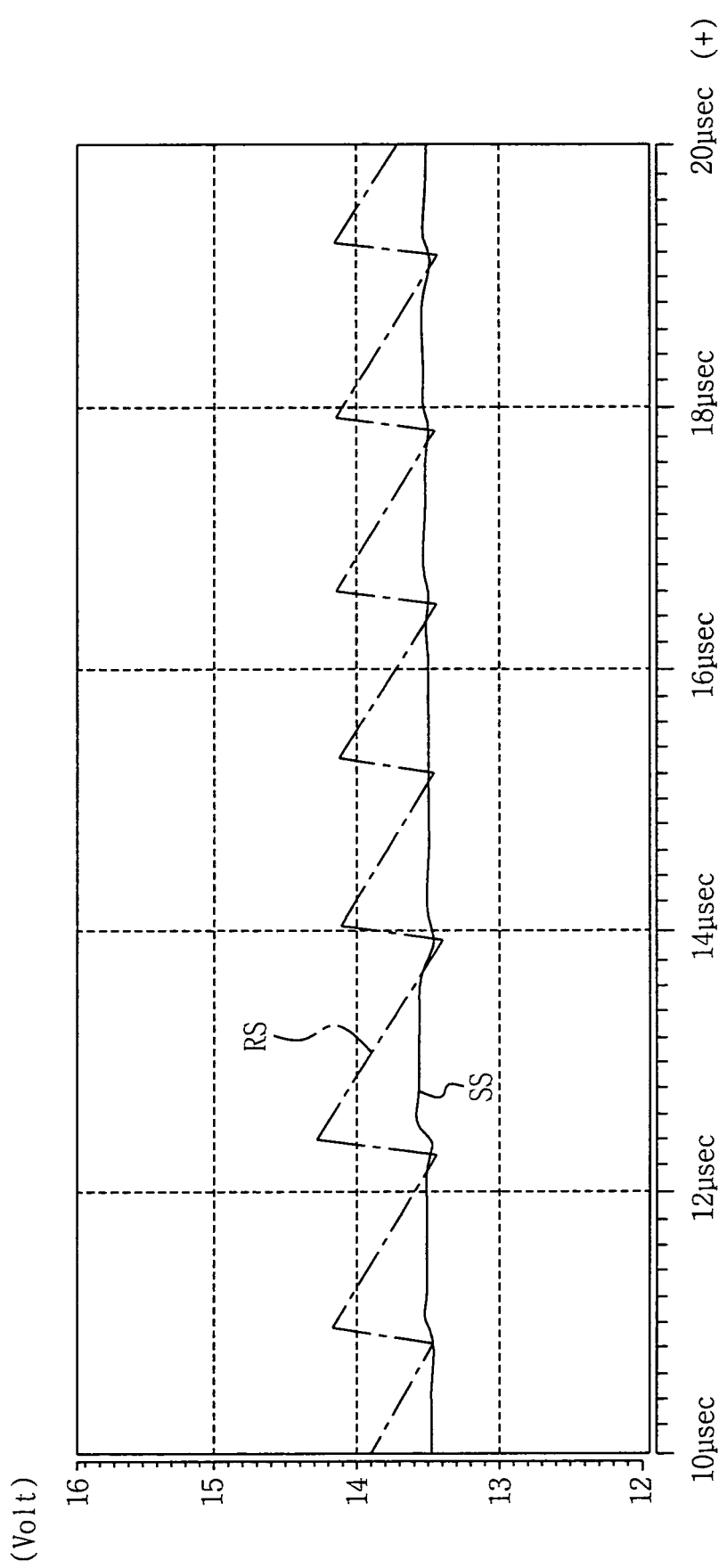
FIG. 4 is a graph illustrating a simulation of operation of a ripple reduction in the high voltage generating circuit shown in FIG. 3.

FIG. 4 is a graph illustrating a simulation operation of ripple reduction in the high voltage generating circuit shown in FIG. 3. FIG. 4 illustrates a waveform SS appearing as a solid line according to an exemplary embodiment of the present invention. A waveform RS appearing as a chain line is provided at the pumping output terminal L1 of the high voltage pump 2, and has a ripple voltage. A transverse axis designates a time based on units of microseconds and a longitudinal axis indicates a voltage based on a unit of volts. As shown in FIG. 4, the ripple reduction circuit 3 substantially reduces a ripple of the voltage output at the terminal L1.

Figure 5A:
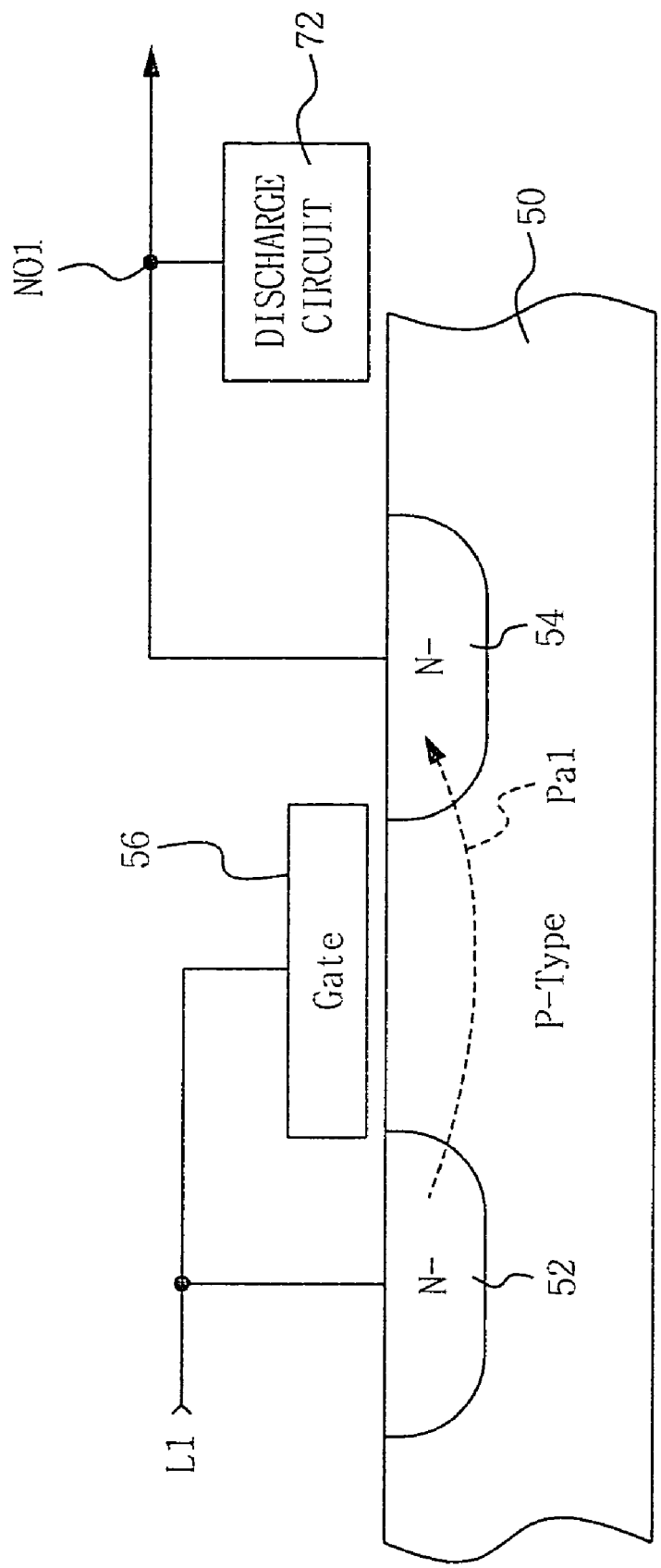
FIG. 5a illustrates a conventional ripple reduction circuit
Figure 5B:
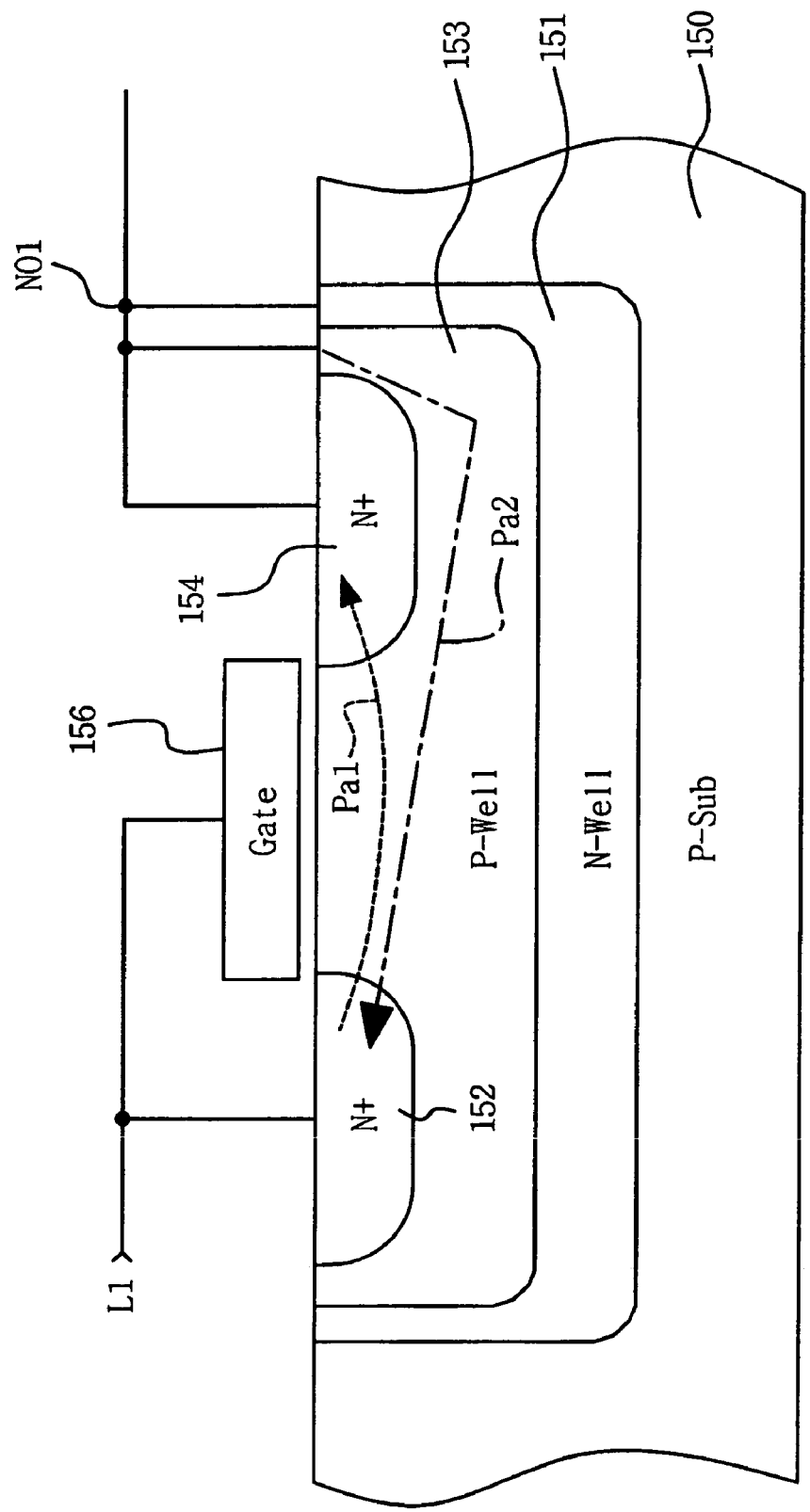
FIG. 5b illustrates a ripple reduction circuit according to some embodiment of the present invention.

FIG. 5a is a diagram of a conventional technique for ripple reduction. FIG. 5b is a diagram of a ripple reduction circuit shown in FIG. 3 according to some embodiments of the present invention. Referring first to FIG. 5a, an N-type MOS transistor of a diode connection type in which the source terminal S is not ohmically connected to the bulk region Bulk is illustrated. An n-type drain region 52 and an n-type source region 54 are formed on a p-type substrate 50, with a gate region 56 therebetween. The gate region 56 and the drain region 52 are commonly connected to the pumping output terminal L1. The MOS transistor having this diode connection type functions to reduce voltage ripple, however, the MOS transistor should be manufactured to withstand a high voltage existing in an output node NO1 while the high voltage pump is disabled. Furthermore, a discharge circuit 72 may be needed in order to discharge the high voltage while the high voltage pump is disabled.

As shown in FIG. 5b, an N-type MOS transistor having a diode connection type in which the source terminal S is ohmically connected to the bulk region Bulk may be provided. A p-well 153 is formed within an n-well 151 formed on the p-type substrate 150. The N-type drain region 152 and the N-type source region 154 are formed with the gate region 156 therebetween. The gate region 156 and the drain region 152 are commonly connected to the pumping output terminal L1 and the source region 154, the P-well 153 and the N-well 151 are commonly connected to the node NO1. The MOS transistor having this diode connective type functions to reduce voltage ripple and simultaneously functions as discharging a high voltage existing in the output node NO1 through a path Pa2 while the high voltage pump is disabled. In the drawing a path Pa1 indicates a path where a ripple voltage is clamped by the diode function of the MOS transistor, and the path Pa2 designates a path where an electric discharge is performed through the bulk region Bulk while the high voltage pump is disabled.

That is, the MOS transistor of FIG. 5b can be formed in a relatively small size as compared with the MOS transistor of FIG. 5a. Also there may be no need to provide a separate discharge circuit for discharging the high voltage when the high voltage pump is disabled.

Consequently, in FIG. 5a the transistor may be damaged since a voltage of the drain terminal is lowered and a high voltage of the source terminal is maintained. Meanwhile, in FIG. 5b damage to the transistor may be prevented because the high voltage of the source terminal is lowered by a P-N forward bias of the bulk region and the drain terminal, thus a transistor need not be able to withstand a high voltage. Furthermore, a higher degree of integration may be provided as there may be no need to employ the separate discharge circuit.

Figure 6:
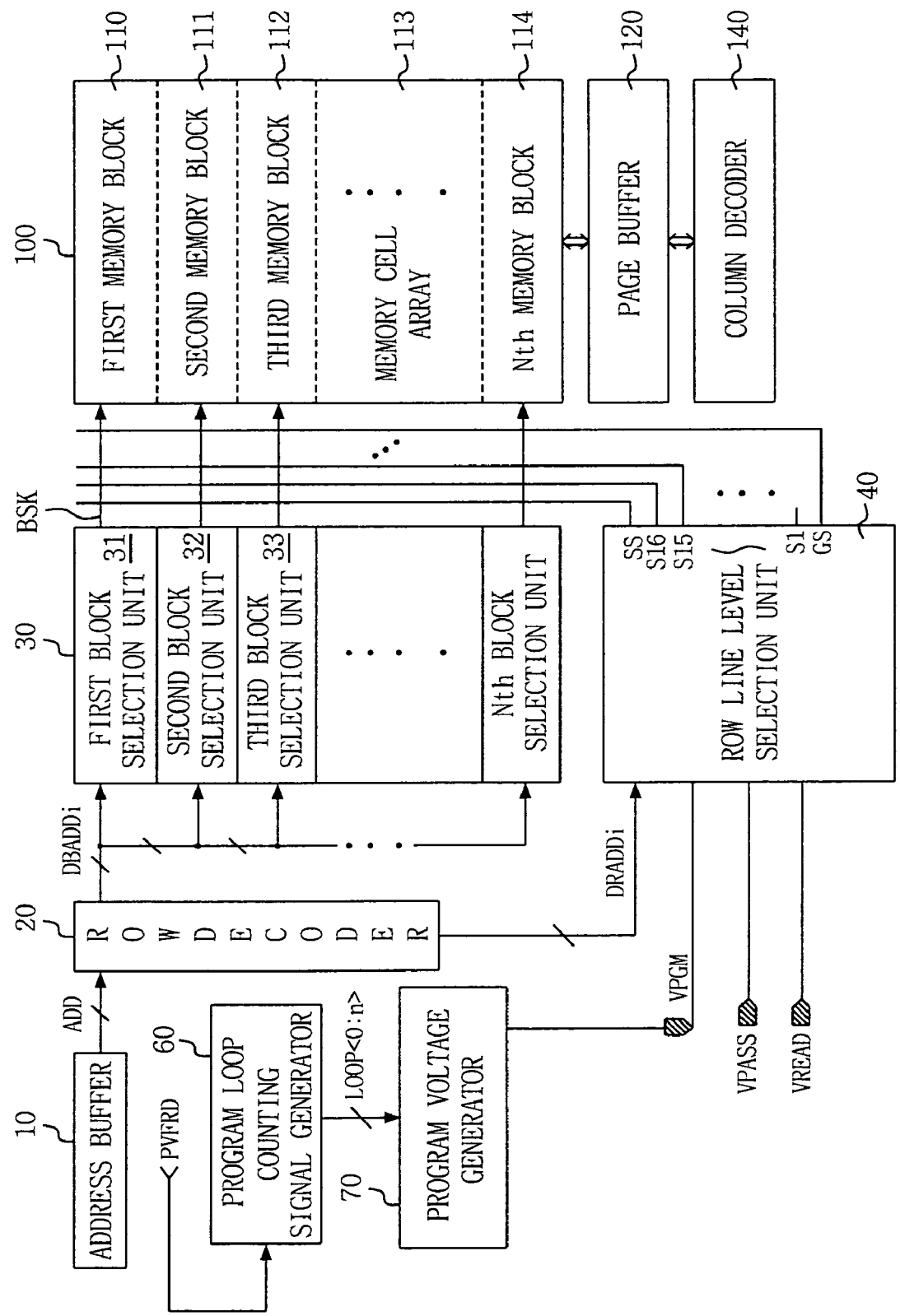
FIG. 6 is a block diagram illustrating in example of a nonvolatile semiconductor memory device to which the circuit of FIG. 3 is applicable.
Figure 7:
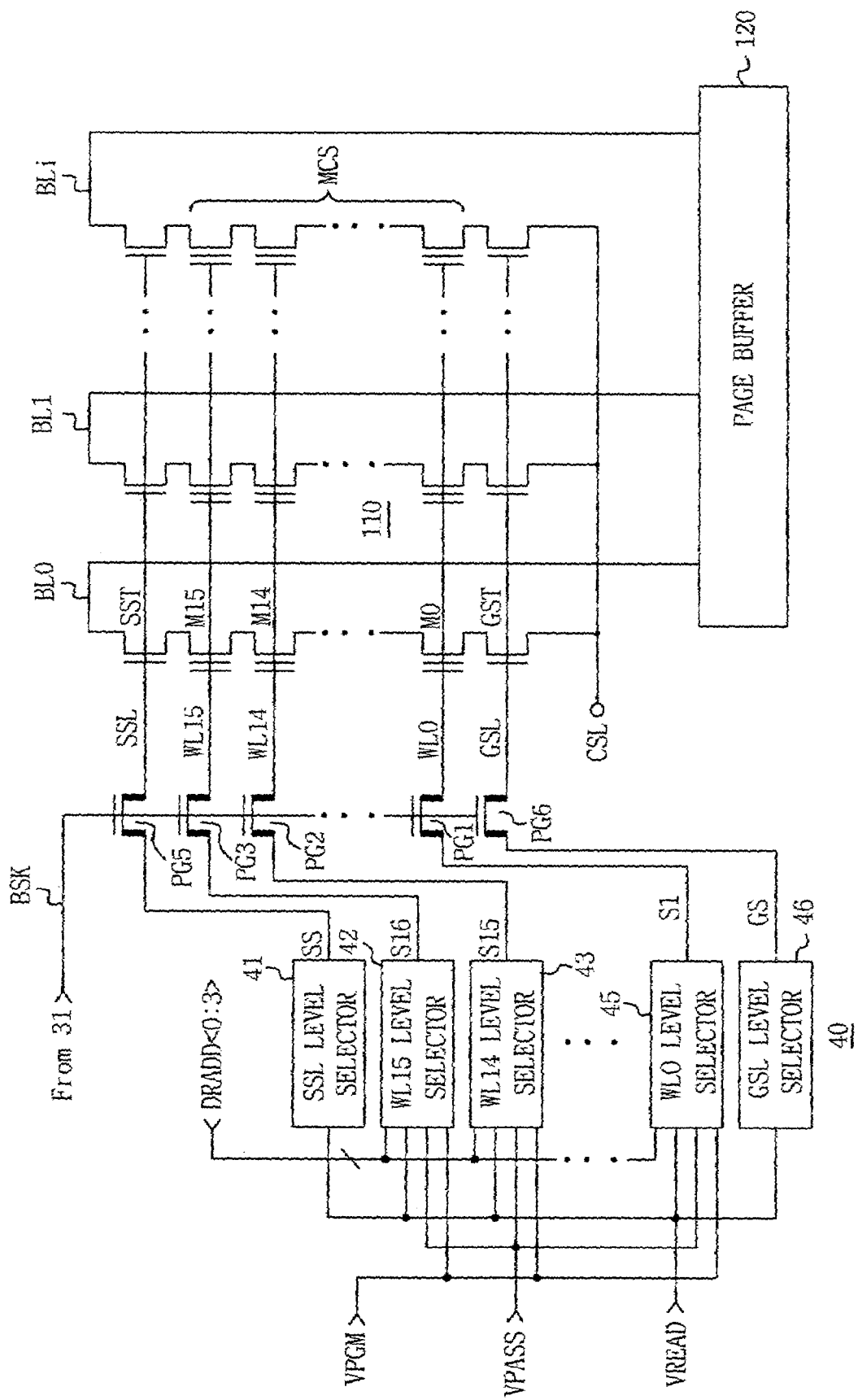
FIG. 7 illustrates in detail some blocks shown in FIG. 6.

FIG. 6 is a block diagram of a nonvolatile semiconductor memory device to which the circuit of FIG. 3 is applicable. FIG. 7 illustrates in detail some blocks shown in FIG. 6.

That is, FIG. 6 illustrates the circuit related to a program of the nonvolatile semiconductor memory device, and FIG. 7 shows in detail a connective correlation between a first memory block 110 and a row line level selection unit 40 shown in FIG. 6. Referring to FIG. 6, there is a connective configuration among an address buffer 10, a row decoder 20, a block selection unit 30 including first through Nth block selection units 31, 32, 33, a row line level selection unit 40, a program loop counting signal generator 60, a program voltage generator 70, a memory cell array 100 including first through Nth memory blocks 110, 111, 112, 113 and 114, a page buffer 120 and a column decoder 140.

Referring to FIG. 7, in the memory cell array 100 a memory cell string MCS, having a plurality of memory cells M0–M15 that are connected with one another in series, is connected to each corresponding bit line BL0–Bli through a string selection transistor SST. The memory cell array 100 includes a plurality of NAND type cell blocks 110–114 in which a plurality of memory cells arrayed on the same row within each memory cell string MCS are commonly connected to a corresponding word line WL0–WL15. In FIG. 7, EEPROM cell transistors M15–M0 constituting each memory cell string are connected in series between a source of the string selection transistor SST and a drain of a ground selection transistor GST. In each memory cell string a drain of the string selection transistor SST is connected to a corresponding bit line and a source of the ground selection transistor GST is connected to a common source line CSL. Respective gates of the string selection transistors SST are commonly connected to a string selection line SSL, and gates of the ground selection transistors GST are commonly connected to a ground selection line GSL. Control gates of the EEPROM cell transistors M15–M0 of each string are connected in common to a corresponding word line among word lines WL0–WL15, and each bit line BL1–BLi is operatively connected to the page buffer 120. The plurality of memory cells M0–M15 as the EEPROM cell transistors are erased initially to have a threshold voltage of, e.g., about −3V. To program a memory cell, a high voltage is applied to a word line of a selected memory cell for a predetermined time, then the selected memory cell is changed to have a higher threshold voltage, meanwhile threshold voltages of memory cells not selected in programming are not changed.

The program voltage generator 70 is configured as illustrated in FIG. 3 and includes a conventional high voltage pump 2 and a ripple reduction circuit 3.

Word line level selectors of the row line level selection unit 40 respectively include a switch pump, and apply a pass voltage VPASS, a read voltage VREAD and a program voltage provided from the program voltage generator 70, to the word lines in conformity with row address decoding information DRADDi.

As the above-described, by providing the circuit of FIG. 3 to the program voltage generator 70 of FIG. 6, a voltage ripple contained in an output program voltage is reduced or removed and the circuit as a diode coupled transistor itself can perform an electric discharge function when the charge pump is disabled without the need for a separate discharge circuit. The circuit of FIG. 3 can be applied, not only to the program voltage generator 70 of FIG. 6, but also to an erase voltage generator for generating an erase voltage.

As described above, in a high voltage generating circuit of a nonvolatile semiconductor memory device according to some embodiments of the present invention, a voltage ripple may be reduced or removed and an integrated discharge path can be provided, thus eliminating the need for a separate discharge circuit. Thus, the circuit may occupy only a small area of a semiconductor memory device.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. For example, a type of diode-coupled transistor and the number of transistors can be varied diversely. Accordingly, these and other changes and modifications are seen to be within the true spirit and scope of the invention as defined by the appended claims.

That which is claimed is:

1. A high voltage generating circuit for use in a semiconductor memory device, the circuit comprising:
   a charge pump for generating a high voltage; and
   a ripple reduction circuit for limiting a voltage level of the high voltage applied from a pumping output terminal of the charge pump when the charge pump is in a first operating mode, and outputting the voltage level limited high voltage as a ripple-reduced high voltage to an output terminal, the ripple reduction circuit having a charge discharge path that is provided from the output terminal to the pumping output terminal when the charge pump is in a second operating mode.

2. The circuit of claim 1, wherein the ripple reduction circuit comprises is a MOS transistor of a diode connection type.

3. The circuit of claim 1, wherein the ripple reduction circuit comprises a single MOS transistor of a diode connection type.

4. The circuit of claim 1, wherein the ripple reduction circuit comprises at least one n-type MOS transistor in which a gate terminal and a drain terminal are connected in common to the charge pump output terminal and in which a source terminal is connected to a bulk region of the at least one n-type MOS transistor.

5. A nonvolatile semiconductor memory device, comprising:
   a memory cell array having memory cells that are connected in a matrix type with a plurality of bit lines and a plurality of word lines;
   row and column decoders for decoding an address signal and selecting the word line and the bit line;
   a program loop counting signal generator for generating a loop counting signal;
   a program voltage generator for generating a program voltage utilizing a charge pump in response to the loop counting signal, the program voltage generator having a ripple reduction circuit for limiting a voltage for a high voltage applied from a pumping output terminal of the charge pump when the charge pump is in a first operating mode, and for outputting the ripple-reduced high voltage as the program voltage to an output terminal, the ripple reduction circuit having a charge discharge path that is provided from the output terminal to the pumping output terminal when the charge pump is in a second operating mode; and
   a row line level selection unit for applying one of a pass voltage, a read voltage and a program voltage provided from the program voltage generator to the word lines in conformity with row address decoding information during a program operating mode.

6. The device of claim 5, wherein the ripple reduction circuit comprises at least one n-type MOS transistor in which a gate terminal and a drain terminal are connected in common to the pumping output terminal and in which a source terminal is connected to a bulk region.

7. A nonvolatile semiconductor memory device, comprising:
   a memory cell array having memory cells that are connected in a matrix type with a plurality of bit lines and a plurality of word lines;
   row and column decoders for decoding an address signal and selecting the word line and the bit line;
   an erase voltage generator for generating an erase voltage utilizing a charge pump, the erase voltage generator having a ripple reduction circuit for limiting a voltage for a high voltage applied from a pumping output terminal of the charge pump when the charge pump is in a first operating mode, and for outputting the ripple-reduced high voltage as the erase voltage to an output terminal, the ripple reduction circuit having a charge discharge path that is provided from the output terminal to the pumping output terminal when the charge pump is in a second operating mode; and
   a row line level selection unit for applying a pass voltage, a read voltage and an erase voltage provided from the erase voltage generator, to the word lines in conformity with row address decoding information during an erase operating mode.

8. The device of claim 7, wherein the ripple reduction circuit comprises at least one n-type MOS transistor in which a gate terminal and a drain terminal are commonly connected to the pumping output terminal and in which a source terminal is connected to a bulk region.

9. A nonvolatile semiconductor memory device, comprising:
   a memory cell array having a plurality of cell blocks, the cell blocks respectively having a plurality of cell units that are connected with one another at a crossing point of row and column;
   a plurality of row and column decoders selected or unselected by an address corresponding to the plurality of cell blocks;
   a plurality of row and column control circuits for controlling the row and column decoders; and
   an operation control circuit, which operates to enable to perform program, erase and read operations through the plurality of row and column control circuits, the operation control circuit having a high voltage pump to generate a high voltage higher than power source voltage and having a ripple removal circuit that is connected to the high voltage pump so as to remove a voltage ripple and that forms a discharge path while the high voltage pump is disabled, wherein the ripple reduction circuit comprises an n-type MOS transistor in which a gate terminal and a drain terminal are commonly connected to a pumping output terminal and in which a source terminal is connected to a bulk region.

10. The device of claim 9, wherein the ripple reduction circuit is constructed of a plurality of MOS transistors which are diode-coupled.

11. A high voltage generating circuit for use in a semiconductor memory device, the circuit comprising:
   a charge pump for generating a high voltage at a charge pump output terminal; and
   a ripple reduction circuit electrically coupled to the charge pump and configured to clamp the high voltage at the charge pump output terminal to reduce ripple in the high voltage when the charge pump is enabled and output the clamped voltage to a ripple reduction circuit output terminal and provide a charge discharge path from the ripple reduction circuit output terminal to the charge pump output terminal when the charge pump is disabled.

12. The circuit of claim 11, wherein the ripple reduction circuit comprises a MOS transistor having a first controlled terminal and a controlling terminal coupled to the charge pump output terminal and a second controlled terminal and a bulk region coupled to the ripple reduction circuit output terminal.

13. The circuit of claim 12, wherein the MOS transistor comprises an n-type MOS transistor, the first controlled terminal comprises a drain, the first controlling terminal comprises a gate and the second controlled terminal comprises a source of the n-type MOS transistor.

14. The circuit of claim 11, wherein the ripple reduction circuit comprises an n-type MOS transistor comprising:
   a p-type semiconductor substrate;
   an n-type semiconductor well region in the p-type semiconductor substrate;
   a p-type semiconductor well region in the n-type semiconductor well region;
   n-type semiconductor source and drain regions in the p-type semiconductor well region; and
   a gate contact disposed between the source and drain regions.

15. The circuit of claim 14, wherein the drain region and the gate contact are electrically coupled to the charge pump output terminal and the source region, the p-type semiconductor well region and the n-type semiconductor well region are electrically coupled to the ripple reduction circuit output terminal.

16. A non-volatile semiconductor memory device comprising the high voltage generating circuit of claim 11.

17. A non-volatile semiconductor memory device of claim 16, wherein the high voltage generating circuit is configured to generate a program voltage and/or an erase voltage.

18. A circuit for coupling a high voltage charge pump to a semiconductor memory, comprising a transistor having a bulk region of the transistor coupled to an input or an output of the transistor so as to provide an integrated discharge path from the output of the transistor to the input of the transistor through the bulk region when the high voltage charge pump is not enabled and block the discharge path through the bulk region when the high voltage charge pump is enabled.

19. The circuit of claim 18, wherein the transistor comprises an n-type MOS transistor, wherein the drain and gate of the transistor are coupled together and to the input of the transistor and the source and the bulk region are coupled together and to the output of the transistor.

* * * * *